United States Patent [19]

Nozaki

[11] Patent Number: 5,502,337
[45] Date of Patent: Mar. 26, 1996

[54] SEMICONDUCTOR DEVICE STRUCTURE INCLUDING MULTIPLE INTERCONNECTION LAYERS WITH INTERLAYER INSULATING FILMS

[75] Inventor: Masahiko Nozaki, Hyogo, Japan

[73] Assignee: Mitsubishi Denki Kabushiki Kaisha, Tokyo, Japan

[21] Appl. No.: 344,572

[22] Filed: Nov. 18, 1994

[30] Foreign Application Priority Data

Jul. 4, 1994 [JP] Japan ................................ 6-152086

[51] Int. Cl.$^6$ ................................. H01L 23/48
[52] U.S. Cl. ........................ 257/773; 257/774; 257/775; 257/786
[58] Field of Search ..................... 257/773, 775, 257/786, 774

[56] References Cited

U.S. PATENT DOCUMENTS 4,636,832  1/1987  Abe et al. ............................. 257/786
5,248,903  9/1993  Heim .................................... 257/786

FOREIGN PATENT DOCUMENTS 4-167449  6/1992  Japan .................................... 257/774

*Primary Examiner*—William Mintel
*Assistant Examiner*—Roy Potter
*Attorney, Agent, or Firm*—Lowe, Price, Leblanc & Becker

[57]  ABSTRACT

The present invention relates to a bonding pad electrode structure having sufficiently large allowable current and improved to prevent generation of cracks in an interlayer insulating film by mechanical stress at the time of wire bonding. Interlayer insulating films are provided directly on a semiconductor substrate. An uppermost interconnection layer is provided on interlayer insulating films. Since a lower interconnection layer does not exist immediately below a portion of the uppermost interconnection layer used as a bonding pad, cracks are not generated in the interlayer insulating films at the time of wire bonding. Further, since the uppermost interconnection layer is connected to lower interconnection layers, the current entering the bonding pad is dispersed to these interconnection layers.

6 Claims, 11 Drawing Sheets

5,502,337

SEMICONDUCTOR DEVICE STRUCTURE INCLUDING MULTIPLE INTERCONNECTION LAYERS WITH INTERLAYER INSULATING FILMS

BACKGROUND OF THE INVENTION

1. Field of the Invention

The present invention generally relates to a semiconductor device and, more specifically, to a bonding pad electrode structure which is improved to have sufficiently large allowance current and to prevent generation of cracks in an interlayer insulating film derived from mechanical stress at the time of wire bonding.

2. Description of the Background Art

FIG. 8 is a plan view of a conventional wafer. On a wafer 10, a plurality of chips 11 are formed. On the chip 11, a semiconductor device is formed (not shown).

FIG. 9 is an enlarged view of the chip 11. A circuit (I/O buffer circuit or input protecting circuit) 12 is provided on chip 11. Bonding pads 13 are formed on chip 11.

Referring to FIG. 10, chip 11 is mounted on a metal frame 14, bonded to a lead 17 by means of a wire 15, and then sealed by a resin 16. Wire 15 connects bonding pad 13 and lead 17. FIG. 11 is an enlarged view of the terminal on the chip, that is, the portion of the bonding pad. Bonding pad 13 is classified into a wire bonding area 18 and a drawing line area 19. At drawing line area 19, a drawing line for connecting wire bonding region 18 with the circuit 12 is placed.

FIG. 12 is a cross section of a conventional bonding pad electrode structure. FIG. 12 is a cross section taken along the line XII—XII of FIG. 11.

Referring to FIG. 12, the bonding pad includes a first interlayer insulating film 2a provided on a silicon substrate 1. On first interlayer insulating film 2a, a lower interconnection layer 3 is provided. On the first interlayer insulating film 2a, a second interlayer insulating film 2b is provided to cover lower interconnection layer 3. In the second interlayer insulating film 2b, a via hole 5 is provided for exposing a portion of a surface of the lower interconnection layer 3. An uppermost interconnection layer 4 is provided on the second interlayer insulating film 2b to be in contact with lower interconnection layer 3 through via hole 5. The surface of the uppermost interconnection layer 4 is used as a bonding pad, to which wire 15 is bonded.

The electrode structure of the bonding pad shown in FIG. 12 suffers from the following problem.

Namely, if the diameter of via hole 5 is made about 0.8 μm or smaller, a technique for filling a conductive material in the via hole 5 and forming upper interconnection layer 4 thereon becomes necessary. According to this technique, it is necessary to deposit a conductive material, for example tungsten, on silicon substrate 1 so as to fill contact hole 5 by the CVD method. It is also necessary to etch back the deposited tungsten by dry etching thereafter, so as to leave tungsten only in the via hole. However, this is difficult in such a large via hole 5 as shown in FIG. 12 for the following reasons.

More specifically, referring to FIG. 13, a conductive material, for example, tungsten film 21, is deposited on silicon substrate 1 by the CVD method. Then, when tungsten film 21 is etched back by dry etching as shown in FIG. 14, the via hole 5 which is large, cannot be filled with tungsten but the tungsten film 21 is left only as etching residue on sidewalls of the via hole 5. Such residue of etching would be foreign matter when peeled off, which has significant influence on production yield. This is the problem encountered when the electrode structure of the bonding pad shown in FIG. 12 is employed.

FIG. 15 is a cross section of a conventional bonding pad electrode structure, manufactured using a technique of filling conductive material.

Referring to FIG. 15, the bonding pad portion includes a first interlayer insulating film 2a formed on silicon substrate 1. On the first interlayer insulating film 2a, a lower interconnection layer 3 is provided. A second interlayer insulating film 2b is provided on the first interlayer insulating film 2a to cover lower interconnection layer 3. On the second interlayer insulating film 2b, an uppermost interconnection layer 4 is provided. In the second interlayer insulating film 2b, a via hole 6 having an appropriate size to be filled with a conductive material is provided, connecting the uppermost interconnection layer 4 and the lower interconnection layer 3. In via hole 6, a conductive material 6a for electrically connecting the uppermost interconnection layer 4 and the lower interconnection layer 3 is filled. The uppermost interconnection layer 4 is used as a bonding pad, to which wire 15 is bonded.

The electrode structure of the bonding pad is formed to have multilayered interconnections for the following reasons.

Namely, when amount of current per one electrode increases, the interconnection would be disconnected by electromigration if the interconnection includes only one layer. In order to prevent disconnection, it is necessary to disperse current to a number of layers of a multi-layered interconnection. For this reason, it is necessary to provide connection between the multi-layered interconnection somewhere at the electrode. Conventionally, connection between the multi-layered interconnection has been provided at the wire bonding area.

As described above, in the conventional bonding pad electrode structure cannot satisfy the technique for filling the via hole. In the electrode structure of the bonding pad shown in FIG. 16, cracks 22 may be generated at a portion sandwiched between the uppermost interconnection layer and the lower interconnection layer of the interlayer insulating film 2b during wire bonding as shown in FIG. 16, and therefore reliability cannot be ensured.

SUMMARY OF THE INVENTION

Therefore, an object of the present invention is to provide a bonding pad electrode structure which is improved to prevent disconnection caused by electromigration.

Another object of the present invention is to provide an electrode structure of a bonding pad improved to prevent generation of cracks in the interlayer insulating film during wire bonding.

A semiconductor device in accordance with a first aspect of the present invention includes a semiconductor substrate. On the semiconductor substrate, a lower interconnection layer is provided. An interlayer insulating film is provided on the lower interconnection layer and on the semiconductor substrate so as to cover an area on which the lower interconnection layer is not provided. An uppermost interconnection layer is provided on the interlayer insulating film and to cover the lower interconnection layer and the area at which the lower interconnection layer is not provided. In the interlayer insulating film, a via hole is provided for connecting the uppermost interconnection layer and the lower interconnection layer. In the via hole, a conducting material for electrically connecting the uppermost interconnection layer and the lower interconnection layer is filled. An upper portion of the uppermost interconnection layer in the area where the lower interconnection layer does not exist is used as a bonding pad.

A semiconductor device in accordance with a second aspect of the present invention includes a semiconductor substrate. A circuit is provided on the semiconductor substrate. on the semiconductor substrate, a wire bonding portion is provided apart from the circuit. On the semiconductor substrate, a drawing line portion is provided for connecting the wire bonding portion with the circuit. The wire bonding portion includes a first interlayer insulating film provided directly on the semiconductor substrate, and an uppermost interconnection layer provided directly on the first interlayer insulating film.

The drawing line portion includes a lower interconnection layer provided on the semiconductor substrate, a second interlayer insulating film provided on the semiconductor substrate to cover the lower interconnection layer, and the aforementioned uppermost interconnection layer provided on the second interlayer insulating film. In the second interlayer insulating film, a via hole for connecting the uppermost interconnection layer and the lower interconnection layer is provided. In the via hole, a conductive material for electrically connecting the uppermost interconnection layer and the lower interconnection layer is filled.

A semiconductor device according to a third aspect of the present invention includes a semiconductor substrate. On the semiconductor substrate, an annular lower interconnection layer is provided, with a space provided at the center. An interlayer insulating film is provided on the semiconductor substrate to fill the space and to cover the lower interconnection layer. An uppermost interconnection layer is provided on the interlayer insulating film to cover the portion above the space and to cover the lower interconnection layer. A via hole is provided in the interlayer insulating film for connecting the annular lower interconnection layer and the uppermost interconnection layer. In the via hole, a conductive material for electrically connecting the lower interconnection layer and the uppermost interconnection layer is filled. That portion of the uppermost interconnection layer which is positioned above the space is used as the bonding pad.

According to the semiconductor device in accordance with the first aspect of the present invention, since the uppermost interconnection layer and the lower interconnection layer are connected, the current entering the bonding pad is dispersed to these interconnection layers. Further, since the lower interconnection layer does not exist at a portion immediately below the uppermost interconnection layer used as the bonding pad, that is, a portion of the interlayer insulating film sandwiched by the uppermost interconnection layer and the lower interconnection layer does not exist, cracks are not generated in the interlayer insulating film at the time of wire bonding.

In the semiconductor device in accordance with the second aspect of the present invention, since the uppermost interconnection layer and the lower interconnection layer are connected at the drawing line portion, the current entering the bonding pad is dispersed to these interconnection layers. Further, at the wire bonding portion, since the lower interconnection layer does not exist below the uppermost interconnection layer, cracks are not generated in the interlayer insulating film at the time of wire bonding.

In the semiconductor device in accordance with the third aspect of the present invention, since the uppermost interconnection layer and the lower interconnection layer are connected, the current entering the bonding pad is dispersed in these interconnection layers. Further, since the bonding pad is formed a central space of an annular lower interconnection layer, there is not the lower interconnection layer immediately below the bonding pad. Therefore, cracks are not generated in the interlayer insulating film at the time of wire bonding.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

Embodiment 1

Figure 1:
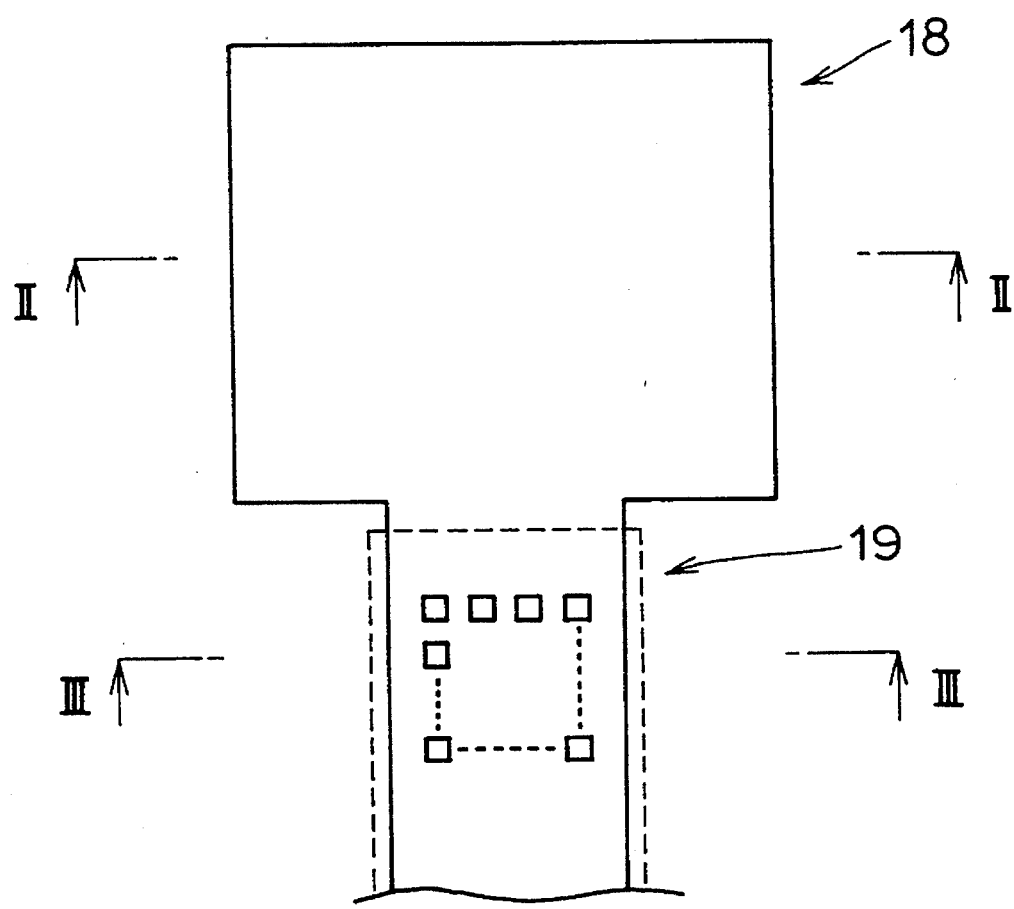
FIG. 1 is a plan view of a bonding pad portion of the semiconductor device in accordance with a first embodiment of the present invention.
Figure 2:
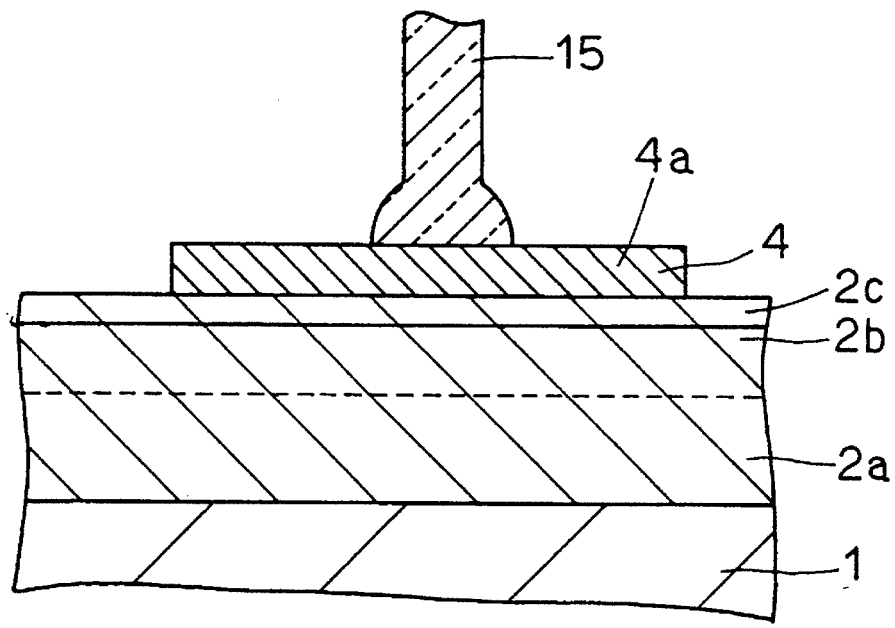
FIG. 2 is a cross section taken along the line II—II of FIG. 1.
Figure 3:
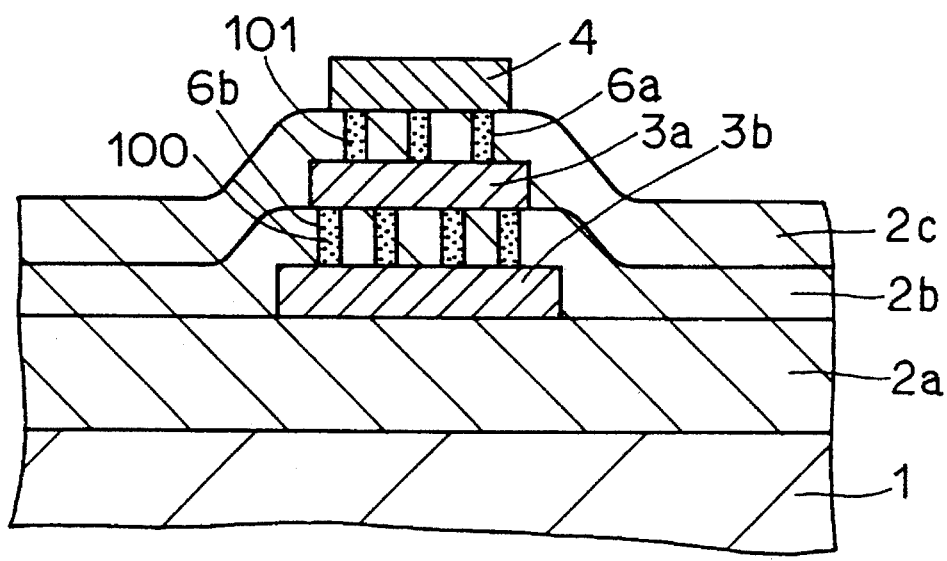
FIG. 3 is a cross section taken along the line III—III of FIG. 1.

FIG. 1 is a plan view of a bonding pad of the semiconductor device in accordance with a first embodiment of the present invention. FIG. 2 is a cross section taken along the line II—II of FIG. 1, and FIG. 3 is a cross section taken along the line III—III of FIG. 1. Referring to FIG. 1, the bonding pad of the semiconductor device in accordance with Embodiment 1 is divided into a wire bonding area 18 and a drawing line area 19. In the wire bonding area 18, referring to FIG. 2, interlayer insulating films 2a, 2b, and 2c are provided directly on a silicon substrate 1. On interlayer insulating films 2a, 2b and 2c, an uppermost interconnection layer 4 is directly provided. Since a lower interconnection layer does not exist immediately below a portion 4a of the uppermost interconnection layer 4 which is used as the bonding pad, in other words, a portion of the interlayer insulating film sandwiched by the uppermost interconnection layer 4 and the lower interconnection layer does not exist, cracks are not generated in interlayer insulating films 2a, 2b and 2c even when stress is applied to the interlayer insulating films 2a, 2b and 2c at the time of bonding the wire 15.

Referring to FIG. 3, in drawing line area 19, a first interlayer insulating film 2a is provided on silicon substrate 1. On the first interlayer insulating film 2a, a first lower interconnection layer 3b is provided. On the first interlayer insulating film 2a, a second interlayer insulating film 2b is provided to cover the first lower interconnection layer 3b. On the second interlayer insulating film 2b, a second lower interconnection layer 3a is provided. On the second interlayer insulating film 2b, a third interlayer insulating film 2c is provided to cover the second lower interconnection layer 3a. On the third interlayer insulating film 2c, an uppermost interconnection layer 4 is provided. In the second interlayer insulating film 2b, a first via hole 6b for connecting the second interconnection layer 3a and the first lower interconnection layer 3b is provided. In the first via hole 6b, a conductive material 100 for electrically connecting the first lower interconnection layer 3b and the second lower interconnection 3a is filled. In the third interlayer insulating film, a second via hole 6a for connecting the uppermost interconnection layer 4 and the second lower interconnection layer 3a is provided. In the second via hole 6a, a conductive material 101 for electrically connecting the uppermost interconnection layer 4 and the second lower interconnection layer 3a is filled. Referring to FIGS. 2 and 3, the current entering from wire 15 to uppermost interconnection layer 4 is dispersed to the uppermost interconnection layer 4, the second lower interconnection layer 3a and the first lower interconnection layer 3b. As a result, a bonding pad electrode having sufficiently large current capacity is obtained.

Embodiment 2

Figure 4:
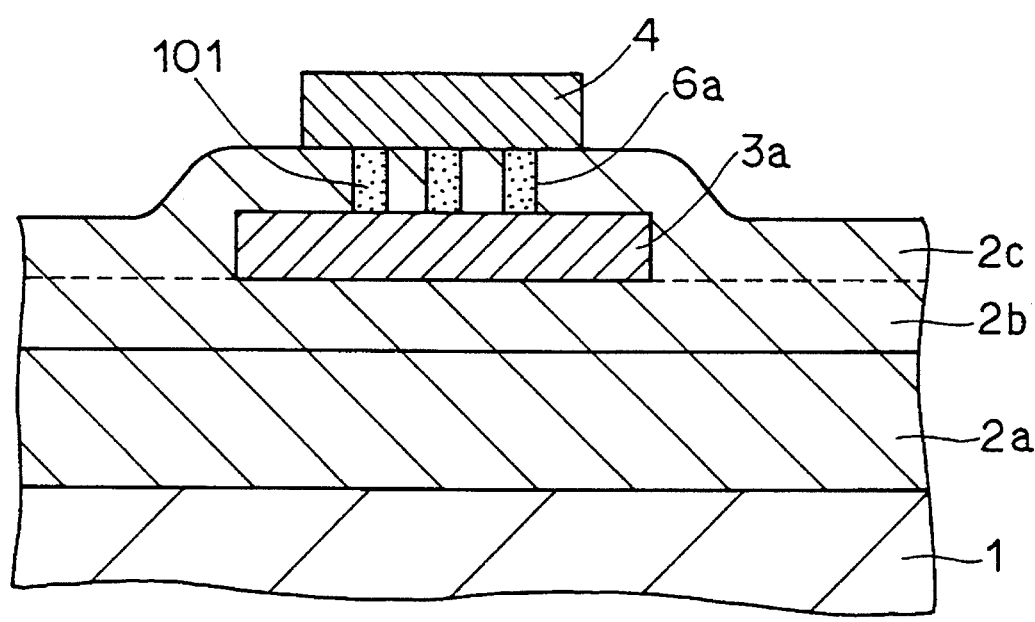
FIG. 4 is a cross section of a drawing line portion of the bonding pad of the semiconductor device in accordance with a second embodiment.

In Embodiment 1, two lower interconnection layers (3a, 3b) are formed, as shown in FIG. 3. However, the present invention is not limited thereto. Namely, referring to FIG. 4, the number of interconnection layers formed continuously counting from the uppermost interconnection layer 4 may be arbitrarily selected to be sufficient for dispersing the current. FIG. 4 shows an example in which only one lower interconnection layer 3a is provided. Since the current is dispersed, disconnection because of electromigration can be prevented even when a large current flows through the bonding pad.

Embodiment 3

Figure 5:
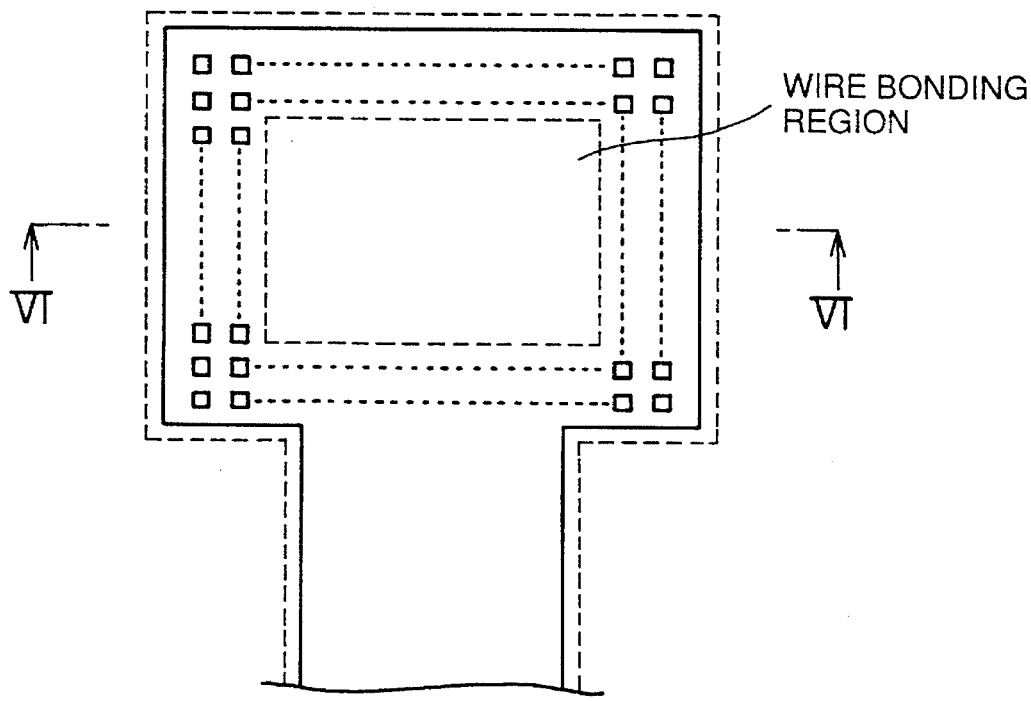
FIG. 5 is a plan view of a bonding pad of the semiconductor device in accordance with a third embodiment of the present invention.
Figure 6:
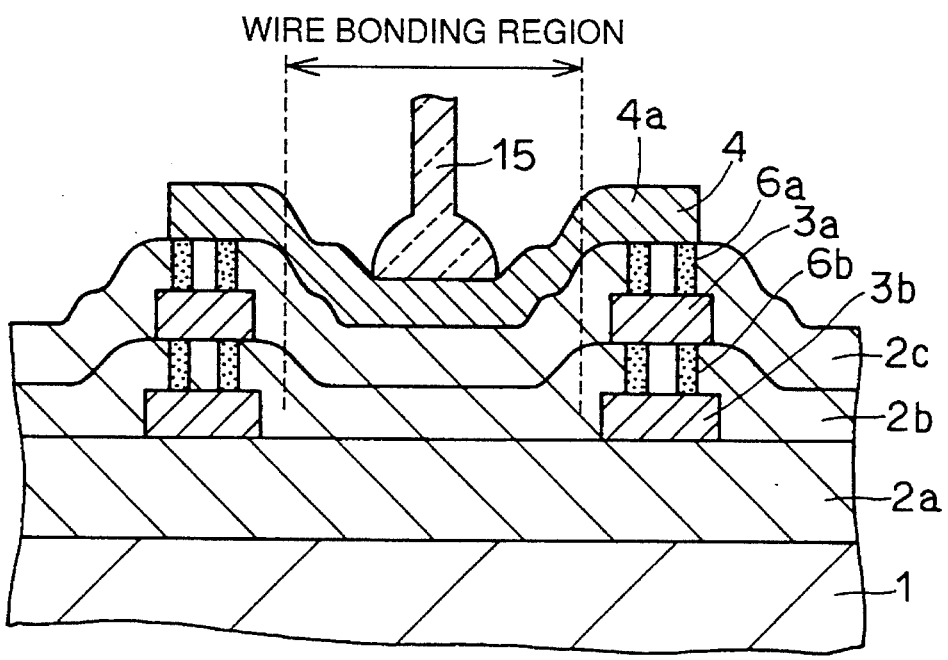
FIG. 6 is a cross section taken along the line VI—VI of FIG. 5.

FIG. 5 is a plan view of a bonding pad electrode in accordance with Embodiment 3. FIG. 3 is a cross section taken along the line VI—VI of FIG. 5.

Referring to these figures, the bonding pad electrode in accordance with this embodiment includes a first interlayer insulating film 2a provided on a silicon substrate 1. On the first interlayer insulating film 2a, an annular first lower interconnection layer 3b is provided so as to provide a space at the center. On the first interlayer insulating film 2a, a second interlayer insulating film 2b is provided to cover the first lower interconnection layer 3b. On the second interlayer insulating film 2b, an annular second lower interconnection layer 3a is provided so as to provide a space at the center. On the second interlayer insulating film 2b, a third interlayer insulating film 2c is provided to cover the second lower interconnection layer 3a. An uppermost interconnection layer 4 is provided on the third interlayer insulating film 2c to cover a portion above the space and to cover the first and second lower interconnection layers 3a and 3b. In the second interlayer insulating film 2b, a first via hole 6b is provided for connecting the first lower interconnection layer 3b and the second lower interconnection layer 3a. In the third interlayer insulating film 2c, a second via hole 6a is provided for connecting the second lower interconnection layer 3a and the uppermost interconnection layer 4. In the first via hole 6b, a conductive material for electrically connecting the first lower interconnection layer 3b and the second lower interconnection layer 3a is filled. In the second via hole 6a, a conductive material for electrically connecting the uppermost interconnection layer 4 and the second lower interconnection layer 3a is filled.

At a portion 4a of the uppermost interconnection layer 4 positioned above the space is used as a bonding pad, to which a wire 15 is bonded.

Since the bonding pad is provided above the space at the center of the annular lower interconnection layers 3a and 3b, the lower interconnection layer does not exist immediately below the bonding pad. Therefore, even when stress is applied to interlayer insulating films 2a, 2b and 2c at the time of bonding the wire 15, cracks are not generated in the interlayer insulating films 2a, 2b and 2c. Further, since the uppermost interconnection layer 4, the second lower interconnection layer 3a and the first lower interconnection layer 3b are electrically connected to each other, the current entering the bonding pad is dispersed to these interconnection layers. Therefore, even when a large amount of current flows through the bonding pad, disconnection by the electromigration can be prevented.

Embodiment 4

Figure 7:
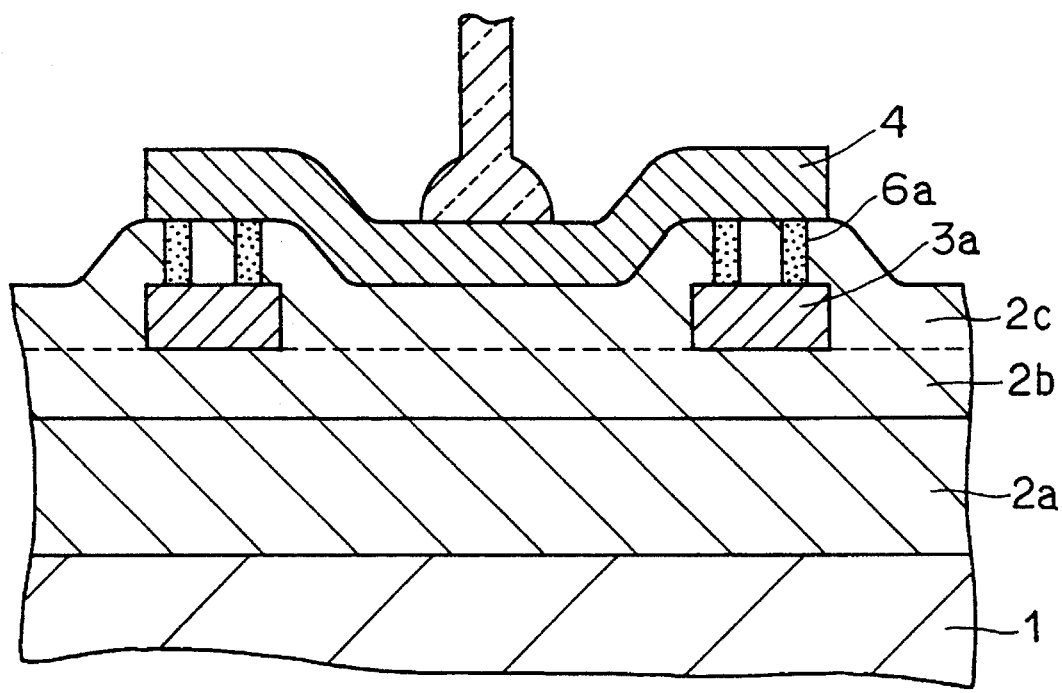
FIG. 7 is a cross section of the bonding pad of the semiconductor device in accordance with a fourth embodiment.
Figure 8:
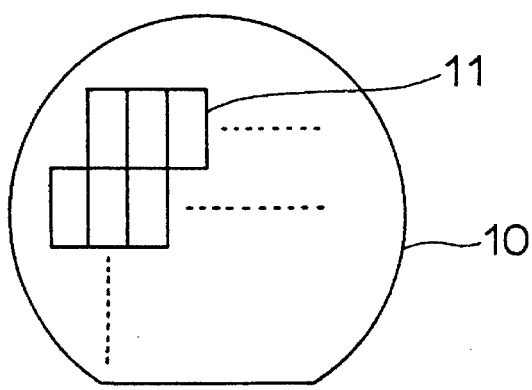
FIG. 8 is a plan view of a conventional wafer.
Figure 9:
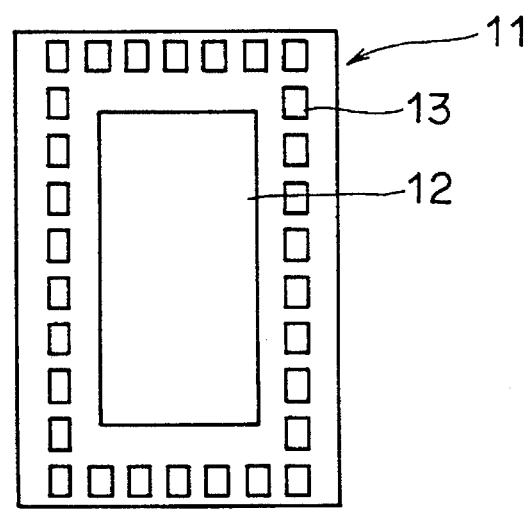
FIG. 9 is an enlarged view of a conventional chip.
Figure 10:
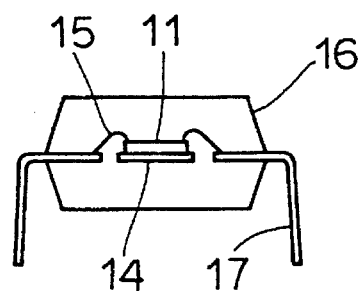
FIG. 10 is an illustration of a conventional resin sealed package.
Figure 11:
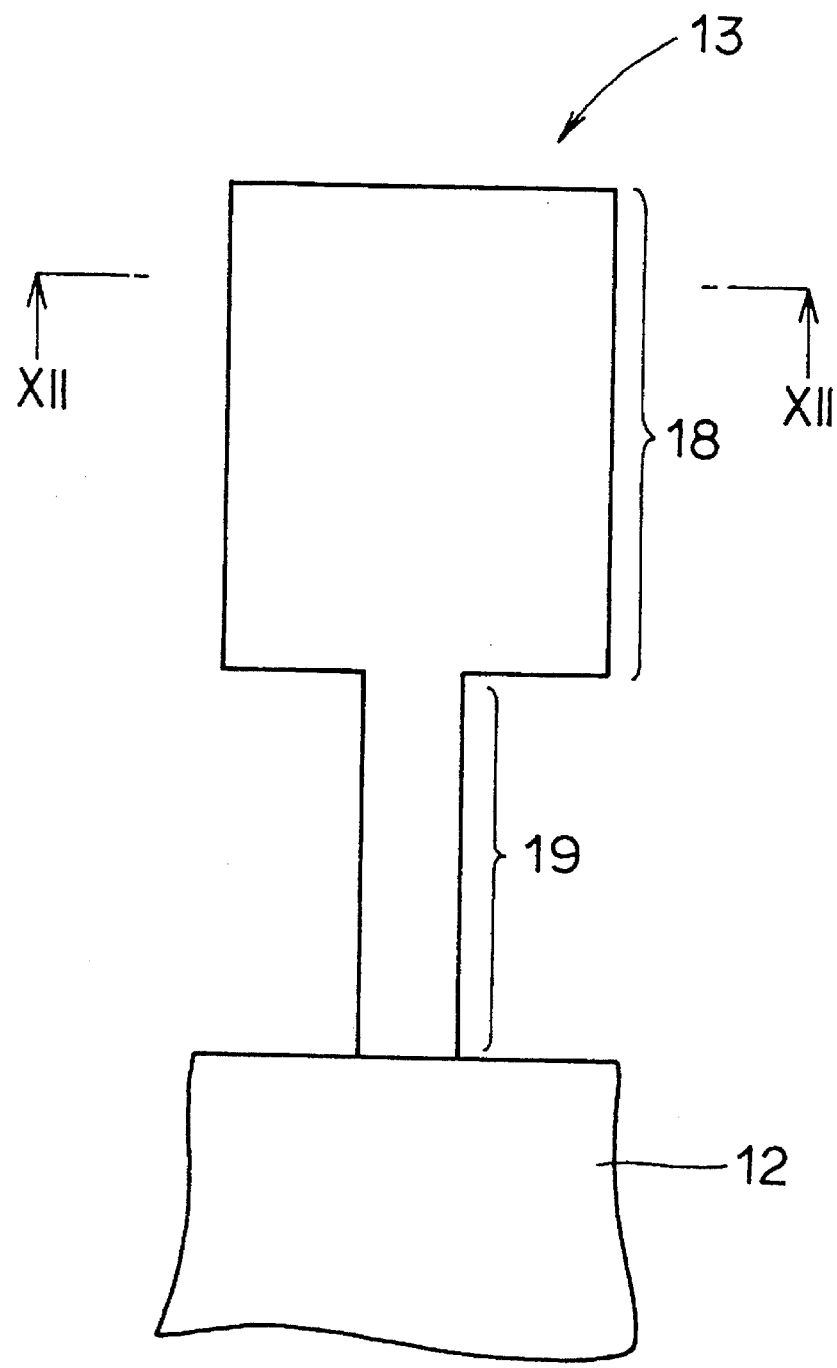
FIG. 11 is an enlarged view of a conventional bonding pad.
Figure 12:
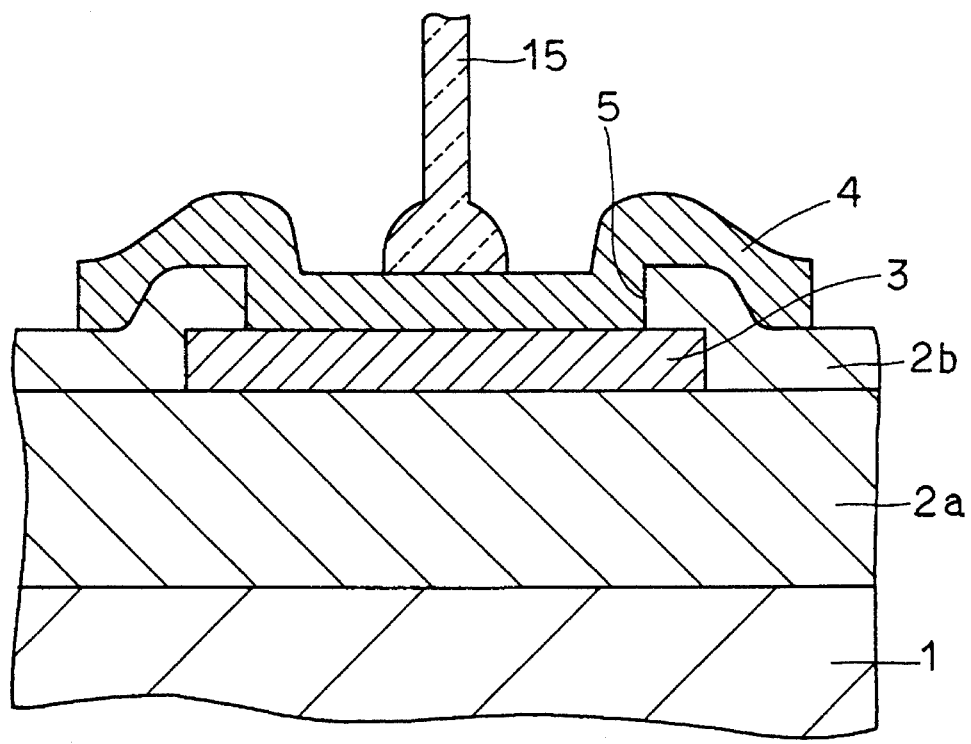
FIG. 12 is a cross section of a conventional bonding pad.
Figure 13:
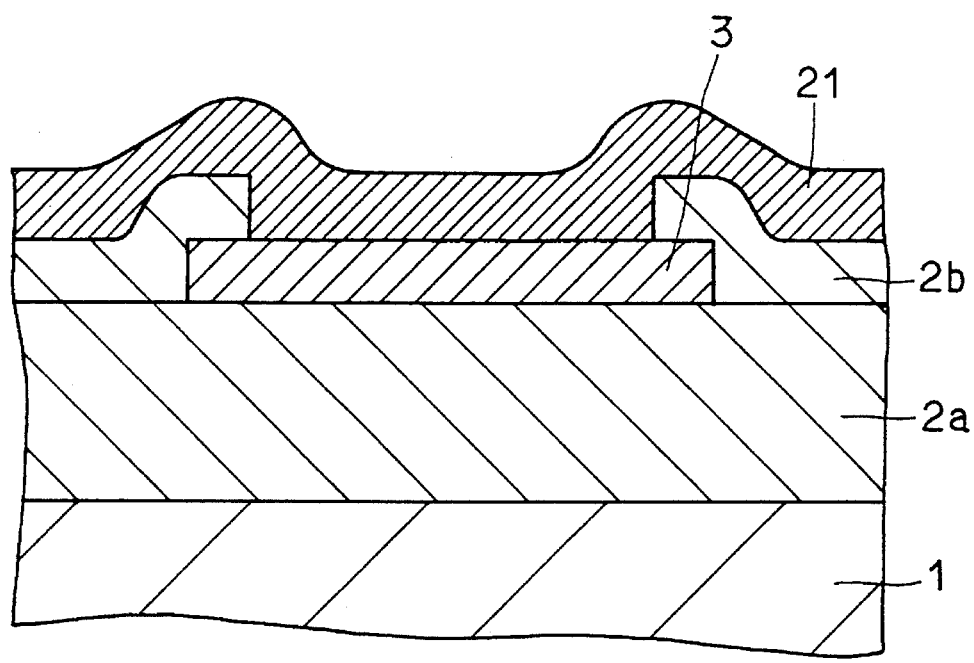
FIG. 13 is a first sectional view of a manufacturing step showing a problem encountered when the bonding pad electrode structure of FIG. 12 is employed.
Figure 14:
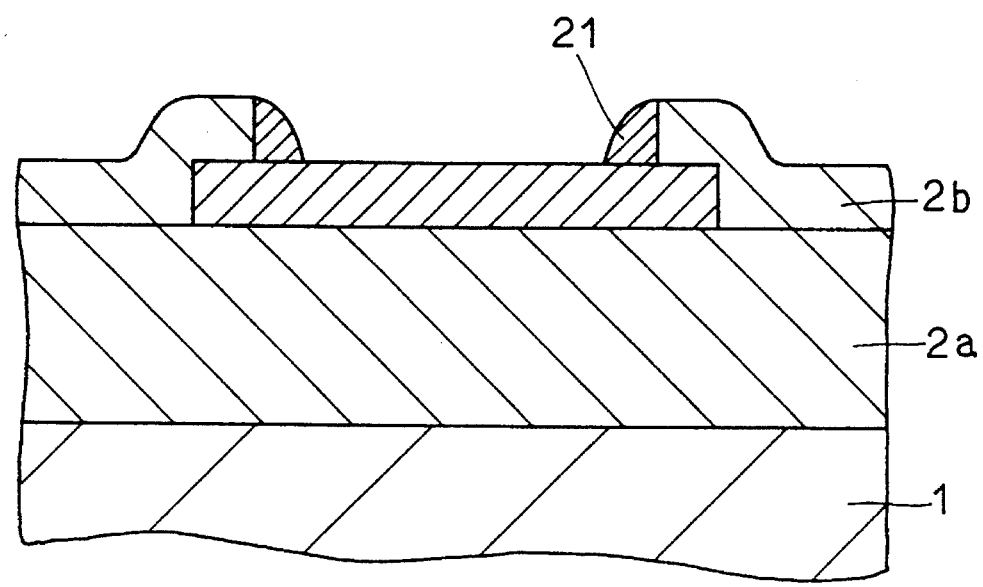
FIG. 14 is a second sectional view of a manufacturing step showing a problem encountered when the bonding pad electrode structure of FIG. 12 is employed.
Figure 15:
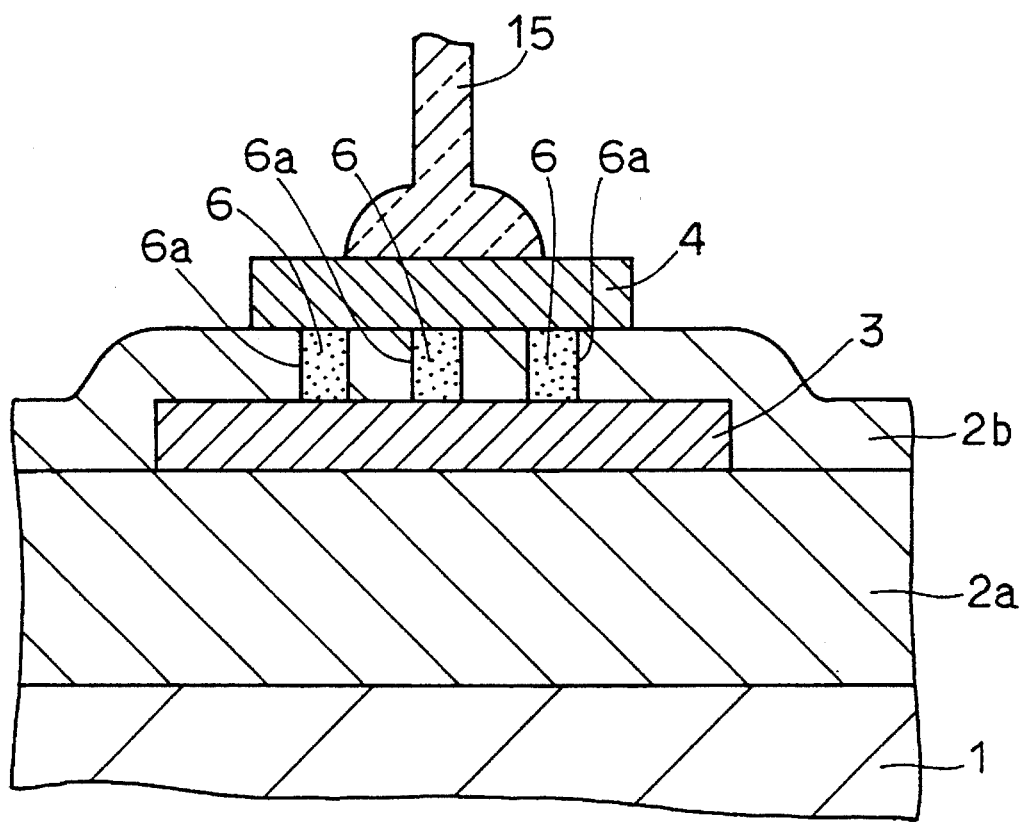
FIG. 15 is a cross section of a second conventional bonding pad.
Figure 16:
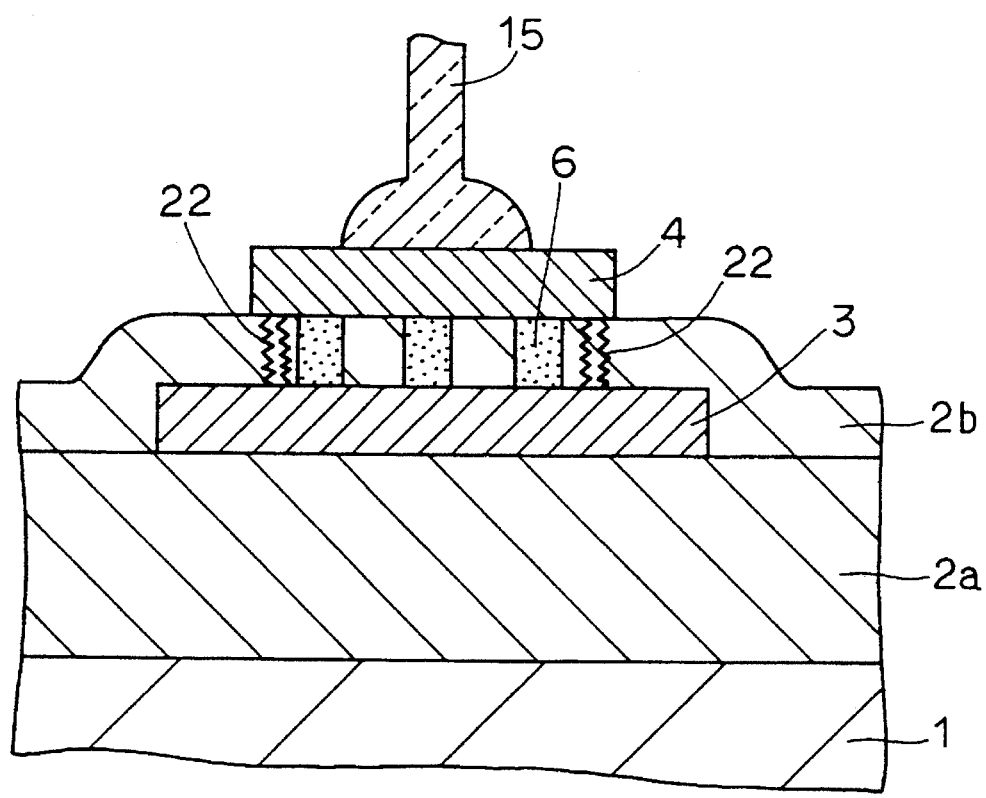
FIG. 16 is a cross section showing the problem of the second conventional bonding pad.

The bonding pad according to Embodiment 3 includes two lower interconnection layers. However, the present invention is not limited thereto. Namely, referring to FIG. 7, the number of interconnection layers formed continuously counting from the uppermost interconnection layer 4 may be arbitrarily selected to be sufficient for dispersing the current. In the bonding pad shown in FIG. 7, only one lower interconnection layer 3a is provided.

As described above, in the semiconductor device in accordance with the first aspect of the present invention, since the uppermost interconnection layer and the lower interconnection layer are electrically connected, the current entering the bonding pad is dispersed to these interconnection layers. Therefore, even when a large amount of current flows through the bonding pad, disconnection by electromigration does not occur. As a result, a bonding pad electrode structure having sufficiently large allowable current can be obtained.

Further, since the lower interconnection layer does not exist immediately below the portion of the uppermost interconnection layer used as the bonding pad, cracks are not generated in the interlayer insulating film at the time of wire bonding. Therefore, a highly reliable semiconductor device can be obtained.

In the semiconductor device in accordance with the second aspect of the present invention, since the uppermost interconnection layer and the lower interconnection layer are electrically connected at the drawing line portion, the current entering the bonding pad is dispersed to these interconnection layers. As a result, even when a large amount of current flows through the bonding pad, disconnection by electromigration does not occur. As a result, a bonding pad electrode having sufficiently large allowable current can be obtained. Further, at the wire bonding portion, since there is not a lower interconnection layer below the uppermost interconnection layer, cracks are not generated in the interlayer insulating film at the time of wire bonding. Therefore, a highly reliable semiconductor device can be obtained.

In the semiconductor device in accordance with the third aspect of the present invention, since the uppermost interconnection layer is electrically connected to an annular lower interconnection layer, the current entering the bonding pad is dispersed into these interconnection layers. Therefore, even when a large amount of current flows to the bonding pad, disconnection by electromigration does not occur.

Further, since the bonding pad is provided at the central space of the annular lower interconnection layer, the lower interconnection layer does not exist immediately below the bonding pad. Therefore, cracks are not generated in the interlayer insulating film at the time of wire bonding.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate;

a circuit provided on said semiconductor substrate;

a wire bonding portion provided apart from said circuit on said semiconductor substrate; and a drawing line portion provided on said semiconductor substrate for connecting said wire bonding portion and said circuit; wherein said wire bonding portion includes first, second and third interlayer insulating films provided directly on said semiconductor substrate, and an uppermost interconnection layer provided directly on said first, second and third interlayer insulating films; and said drawing line portion includes
   (1) a first insulating film provided on said semiconductor substrate,
   (2) a first lower interconnection layer provided on said first insulating film,
   (3) a second insulating film provided on said first insulating film to cover said first lower interconnection layer,
   (4) a second lower interconnection layer provided so as to overlap with said first lower interconnection layer with said second insulating film therebetween,
   (5) a third insulating film provided on said second insulating film to cover said second lower interconnection layer,
   (6) said uppermost interconnection layer provided so as to overlap with said second lower interconnection layer with said third insulating film therebetween, a first via hole provided in said second insulating film;

a first conductive material filled in said first via hole for electrically connecting said first lower interconnection layer and said second lower interconnection layer;

a second via hole provided in said third insulating film;

a second conductive material filled in said second via hole for electrically connecting said uppermost interconnection layer and said second lower interconnection layer.

2. The semiconductor device according to claim 1, wherein said second lower interconnection layer is a second interconnection layer counting from said uppermost interconnection layer.

3. The semiconductor device according to claim 1, wherein said first lower interconnection layer is a third interconnection layer counting from said uppermost interconnection layer.

4. A semiconductor device, comprising:

a semiconductor substrate;

an annular lower interconnection layer provided on said semiconductor substrate with a space at the center;

an interlayer insulating film provided on said semiconductor substrate to fill said space and to cover said lower interconnection layer;

an uppermost interconnection layer provided on said interlayer insulating film to cover said space and to cover said lower interconnection layer;

a via hole provided in said interlayer insulating film for connecting said annular lower interconnection layer and said uppermost interconnection layer; and a conductive material filled in said via hole for electrically connecting said lower interconnection layer and said uppermost interconnection layer; wherein a portion of said uppermost interconnection layer positioned above said space is used as a bonding pad.

5. The semiconductor device according to claim 4, wherein said lower interconnection layer is a second interconnection layer counting from said uppermost interconnection layer.

6. The semiconductor device according to claim 4, wherein a plurality of said via holes are provided in said interlayer insulating film so as to surround said bonding pad.

* * * * *